(12) United States Patent
Kaufmann et al.

(10) Patent No.: US 10,855,060 B2
(45) Date of Patent: Dec. 1, 2020

(54) SWITCHGEAR COOLING SYSTEM COMPRISING A HEAT PIPE, FAN AND THERMOELECTRIC GENERATION

(71) Applicant: ABB Schweiz AG, Baden (CH)

(72) Inventors: Patrik Kaufmann, Baden (CH);
Oleksandr Sologubenko, Bonstetten (CH); Francoise Molitor, Zurich (CH);
Tilo Buehler, Wettingen (CH)

(73) Assignee: ABB Schweiz AG, Zurich (CH)

( * ) Notice: Subject to any disclaimer, the term of this patent is extended or adjusted under 35 U.S.C. 154(b) by 174 days.

(21) Appl. No.: 15/544,530

(22) PCT Filed: Jan. 18, 2016

(86) PCT No.: PCT/EP2016/050917
§ 371 (c)(1),
(2) Date: Jul. 19, 2017

(87) PCT Pub. No.: WO2016/116410
PCT Pub. Date: Jul. 28, 2016

(65) Prior Publication Data
US 2018/0006436 A1 Jan. 4, 2018

Related U.S. Application Data

(60) Provisional application No. 62/105,233, filed on Jan. 20, 2015.

(51) Int. Cl.
*H05K 7/20* (2006.01)
*H01L 35/32* (2006.01)
(Continued)

(52) U.S. Cl.
CPC ............ *H02B 1/565* (2013.01); *H01L 35/32* (2013.01); *H02B 1/56* (2013.01); *H02B 11/04* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 5,419,780 A * 5/1995 Suski ...................... H01L 23/38
136/205
5,544,488 A 8/1996 Reid
(Continued)

FOREIGN PATENT DOCUMENTS

GB 2484954 A * 5/2012 ............. H01L 35/30
GB 2484954 A 5/2012
(Continued)

OTHER PUBLICATIONS

International Search Report in PCT/EP2016/050917 dated Mar. 24, 2016.
Written Opinion in PCT/EP2016/050917 dated Mar. 24, 2016.

*Primary Examiner* — Anatoly Vortman
(74) *Attorney, Agent, or Firm* — Leydig, Voit & Mayer, Ltd.

(57) ABSTRACT

A cooling system includes an evaporator associated with a heat source. A condenser is located at a higher elevation than the evaporator. A heat pipe structure fluidly connects the evaporator with the condenser. A fan forces air through the condenser. A working fluid is in the evaporator so as to be heated to a vapor state, with the heat pipe structure transferring the vapor to the condenser and passively returning condensed working fluid back to the evaporator for cooling of the heat source. A plurality of thermoelectric generators is associated with the condenser and converts heat, obtained from the working fluid in the vapor state, to electrical energy to power the fan absent an external power source. The thermoelectric generators provide the electrical energy to the (Continued)

fan so that a rotational speed of the fan is automatically self-regulating to either increase or decrease based on a varying heat load.

16 Claims, 4 Drawing Sheets

(51) Int. Cl.
*H02B 1/56* (2006.01)
*H02B 11/04* (2006.01)

(52) U.S. Cl.
CPC ..... *H05K 7/20309* (2013.01); *H05K 7/20318* (2013.01); *H05K 7/20327* (2013.01); *H05K 7/20336* (2013.01)

(58) Field of Classification Search
CPC ... H05K 7/20009–202; H05K 7/20309; H05K 7/20318; H05K 7/20327; H05K 7/20336; H01L 23/367–3677; H01L 23/473; H01L 23/46–467; H01L 35/32; H02B 1/565; H02B 1/56; H02B 11/04
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,547,019 A | 8/1996 | Iacullo | |
| 6,003,319 A | 12/1999 | Gilley et al. | |
| 6,418,729 B1 | 7/2002 | Dominguez-Alonso et al. | |
| 6,560,968 B2 | 5/2003 | Ko | |
| 6,948,321 B2 | 9/2005 | Bell | |
| 7,752,852 B2 | 7/2010 | Akei et al. | |
| 7,926,293 B2* | 4/2011 | Bell | F02G 1/043 62/3.2 |
| 2005/0141197 A1* | 6/2005 | Erturk | H01L 23/427 361/700 |
| 2006/0117761 A1 | 6/2006 | Bomann | |
| 2006/0118157 A1* | 6/2006 | Johnson | B82Y 10/00 136/205 |
| 2008/0035195 A1* | 2/2008 | Bell | B60H 1/2215 136/206 |
| 2009/0109620 A1* | 4/2009 | Wang | H01L 23/467 361/697 |
| 2010/0101236 A1* | 4/2010 | Shah | F25B 21/02 62/3.2 |
| 2011/0265779 A1* | 11/2011 | Vandrak | F24H 3/0488 126/93 |
| 2012/0205074 A1* | 8/2012 | Frigiere | F28D 15/0266 165/104.26 |
| 2013/0152989 A1* | 6/2013 | Krinn | F01N 5/025 136/210 |
| 2013/0174551 A1* | 7/2013 | Mahmoud | F01K 25/06 60/649 |
| 2013/0192272 A1* | 8/2013 | Ranalli | F25B 21/04 62/3.3 |
| 2013/0199164 A1* | 8/2013 | Levin | F01N 5/02 60/299 |
| 2014/0054025 A1* | 2/2014 | DeCarr | G05D 23/00 165/287 |
| 2014/0070533 A1* | 3/2014 | Li | F01K 9/00 290/2 |
| 2014/0262178 A1* | 9/2014 | Twohy | F28F 1/00 165/173 |
| 2015/0083180 A1* | 3/2015 | Lang | H01L 35/30 136/207 |
| 2015/0168032 A1* | 6/2015 | Steele | F01N 5/025 62/61 |
| 2015/0192332 A1* | 7/2015 | Hojer | F25B 21/04 62/3.3 |
| 2015/0233647 A1* | 8/2015 | Quisenberry | F28D 15/04 62/3.7 |
| 2015/0243866 A1* | 8/2015 | Iriyama | F01N 5/025 60/320 |
| 2015/0345872 A1* | 12/2015 | Hoang | F28D 15/06 165/274 |
| 2015/0354901 A1* | 12/2015 | Moore | H01L 23/427 165/104.21 |
| 2015/0380626 A1* | 12/2015 | Van Lingen | F23D 3/20 136/212 |
| 2016/0066478 A1* | 3/2016 | Van Den Bergen | G03F 7/70991 361/679.47 |
| 2016/0070318 A1* | 3/2016 | Wu | G06F 1/20 361/679.54 |
| 2016/0096744 A1* | 4/2016 | Rutsch | B01D 1/0058 159/16.1 |
| 2016/0297280 A1* | 10/2016 | Riederer | B60H 1/00278 |
| 2016/0320108 A1* | 11/2016 | Kim | F02C 6/18 |
| 2016/0329480 A1* | 11/2016 | Ahdoot | H01L 35/32 |
| 2016/0355067 A1* | 12/2016 | Barnhart | F25B 21/04 |
| 2017/0077376 A1* | 3/2017 | Orlovskaya | F23C 13/08 |
| 2017/0117103 A1* | 4/2017 | Kennelly | H01H 1/62 |
| 2017/0133572 A1* | 5/2017 | Elsarrag | H01L 35/30 |
| 2017/0222114 A1* | 8/2017 | Timm | H01L 35/32 |
| 2017/0259643 A1* | 9/2017 | Ranalli | B60H 1/00478 |
| 2017/0358432 A1* | 12/2017 | Wang | H01G 9/209 |
| 2017/0370625 A1* | 12/2017 | Hirshberg | H05B 33/0872 |
| 2018/0000108 A1* | 1/2018 | Boggavarapu | A47J 31/4492 |
| 2018/0031293 A1* | 2/2018 | Barot | F25B 15/00 |
| 2018/0080689 A1* | 3/2018 | Ilercil | F25B 21/02 |

FOREIGN PATENT DOCUMENTS

| | | |
|---|---|---|
| KR | 101226635 B1 | 1/2013 |
| WO | 2011008280 | 1/2011 |
| WO | 2011088567 | 7/2011 |
| WO | 2012169989 | 12/2012 |
| WO | 2013020936 | 2/2013 |
| WO | 2013074057 | 5/2013 |

* cited by examiner

SWITCHGEAR COOLING SYSTEM COMPRISING A HEAT PIPE, FAN AND THERMOELECTRIC GENERATION

FIELD

The invention relates to switchgear circuit breakers and, more particularly, to a two-phase cooling system that includes a gravity assisted heat pipe structure with a fan-assisted condenser, with the fan being powered by thermoelectric generators.

BACKGROUND

Switchgear configurations have current limits based on the heat rise over ambient room temperature. It is generally desired to limit the maximum temperature of the hottest spot on the switchgear main bus to 105° C. (a rise of 65° C. over an assumed ambient temperature of 40° C.), as directed by the standard IEEE 37.20.2. Typical medium and high-voltage metal-clad switchgear arrangements have maximum continuous current ratings of about 3000 A, due to heat generation. It is desirable to increase this current rating to about 4000 A.

With reference to FIG. 1, a conventional thermosyphon-based cooling system for a switchgear is shown, generally indicated at 10, which includes a condenser 12, an externally powered fan 14, and an evaporator 16 in thermal contact with a heat source 18 such as a primary contact. The evaporator 16 is filled with a specially selected fluid 20 in the liquid phase. The supplied heat from the heat source 18 leads to a liquid-vapor phase transition, with the vapor rising through a heat pipe structure 22 to the condenser 12 positioned above the evaporator 16. The condenser 16 typically consists of flat tubes in good thermal contact with channels where an airflow F is forced there-through by the fan 14. Both the flat tubes and the air channels are normally equipped with fins in order to enhance the effective heat exchange surface. The necessary condition for functioning of the system 10 is that the temperature of the incoming air is lower than the temperature of the vapor rising from the evaporator 16. If this is the case, heat exchange takes place between the vapor in the tubes and the air flow, the vapor is cooled and undergoes the vapor-liquid phase transition, thus condensates at the inner surface. The condensate returns to the evaporator 16 by the gravity force.

If the rotation speed of the fan 14 is set constant, then the mass flow of air through the condenser 12 remains constant as well. This is acceptable if the heat load is constant and the fan rotation speed is defined to provide an adequate cooling. However, if the heat load varies with time, the constant rotation speed must be pre-defined for a certain maximum heat load even if the heat load is often small or even absent. This leads to an unnecessary electric energy consumption for the fan 14, unnecessary stress for mechanical parts of the fan 14, and increased noise. However, a system of active control of the fan rotation speed, depending on the heat load or temperature difference, requires additional electronics and sensors. For both cases mentioned above, conventionally, the fan 14 needs to be wired with a power supply located elsewhere, e.g., in the switchgear cabinet. Therefore, a cable duct is needed, which makes the installation and, in case of a failure, the repair more complicated.

Thus, there is a need to eliminate the external source of power for the fan and instead use thermoelectric generators, associated with the condenser, to power the fan automatically in a self-regulating manner to either increase or decrease the rotational speed of the fan based on a varying heat load provided by a heat source.

SUMMARY

An objective of the invention is to fulfill the need referred to above. In accordance with an embodiment, this objective is obtained by providing a cooling system including an evaporator constructed and arranged to be associated with a heat source so as to remove heat therefrom. A condenser is located at a higher elevation than the evaporator. A heat pipe structure fluidly connects the evaporator with the condenser. At least one fan is constructed and arranged to force air through the condenser. Working fluid is in the evaporator so as to be heated to a vapor state by the heat source, with the heat pipe structure being constructed and arranged to transfer the vapor to the condenser and to passively return condensed working fluid back to the evaporator for cooling of the heat source. A plurality of thermoelectric generators is associated with the condenser and is constructed and arranged to convert heat, obtained from the working fluid in the vapor state, to electrical energy to power the fan absent an external power source. The thermoelectric generators are constructed and arranged to provide the electrical energy to the fan so that a rotational speed of the fan is automatically self-regulating to either increase or decrease based on a varying heat load provided by the heat source.

In accordance with another aspect of an embodiment, a cooling system for a switchgear is provided. The switchgear has at least one primary contact constructed and arranged to connect to a terminal of a circuit breaker. The cooling system includes an evaporator constructed and arranged to be associated with the primary contact so as to remove heat therefrom. A condenser is located at a higher elevation than the evaporator. A heat pipe structure fluidly connects the evaporator with the condenser. At least one fan is constructed and arranged to force air through the condenser. Working fluid is in the evaporator so as to be heated to a vapor state by the primary contact, with the heat pipe structure being constructed and arranged to transfer the vapor to the condenser and to passively return condensed working fluid back to the evaporator for cooling of the primary contact. A plurality of thermoelectric generators is associated with the condenser and is constructed and arranged to convert heat, obtained from the working fluid in the vapor state, to electrical energy to power the fan absent an external power source.

In accordance with yet another aspect of an embodiment, a method of cooling a member associates an evaporator with the member. The member defines a heat source. A condenser is provided to be located at a higher elevation than the evaporator. The evaporator is fluidly connected with the condenser, and a working fluid is provided in the evaporator. A fan is provided to force air through the condenser. The method transfers heat from the heat source to the working fluid to cause the working fluid to evaporate in the evaporator with the evaporated vapor being delivered to the condenser. Heat, obtained from the evaporated vapor, is converted to electrical energy to power the fan, absent an external power source. The electrical energy is supplied to the fan so that a rotational speed of the fan is automatically self-regulating to either increase or decrease based on a varying heat load provided by the heat source.

Other objectives, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings wherein like numbers indicate like parts, in which.

DETAILED DESCRIPTION OF THE EXEMPLARY EMBODIMENTS

Figure 1:
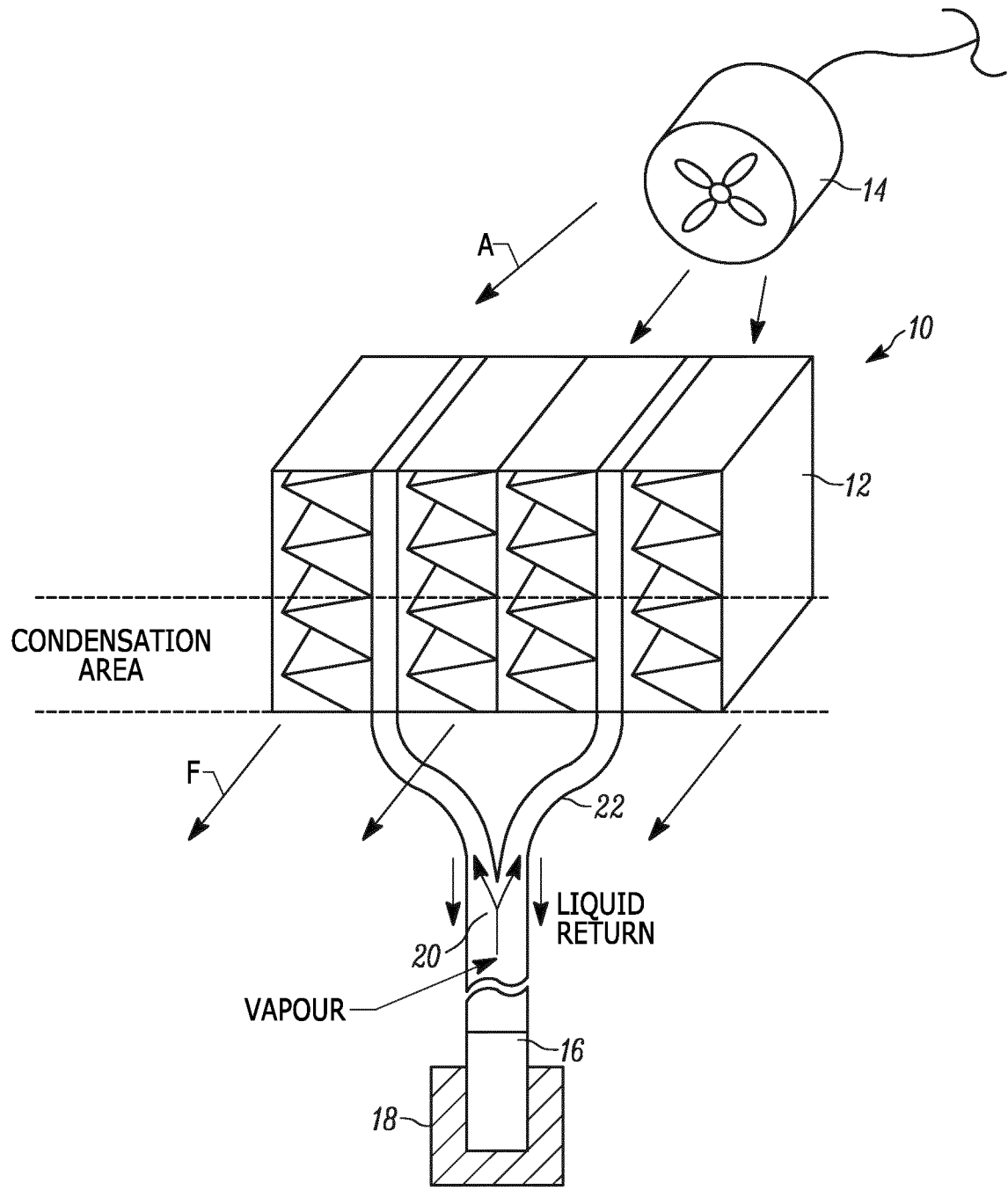
FIG. 1 is a view of a portion of a conventional thermosyphon-based cooling system including a condenser, an externally powered fan and an evaporator connected with the condenser.
Figure 2:
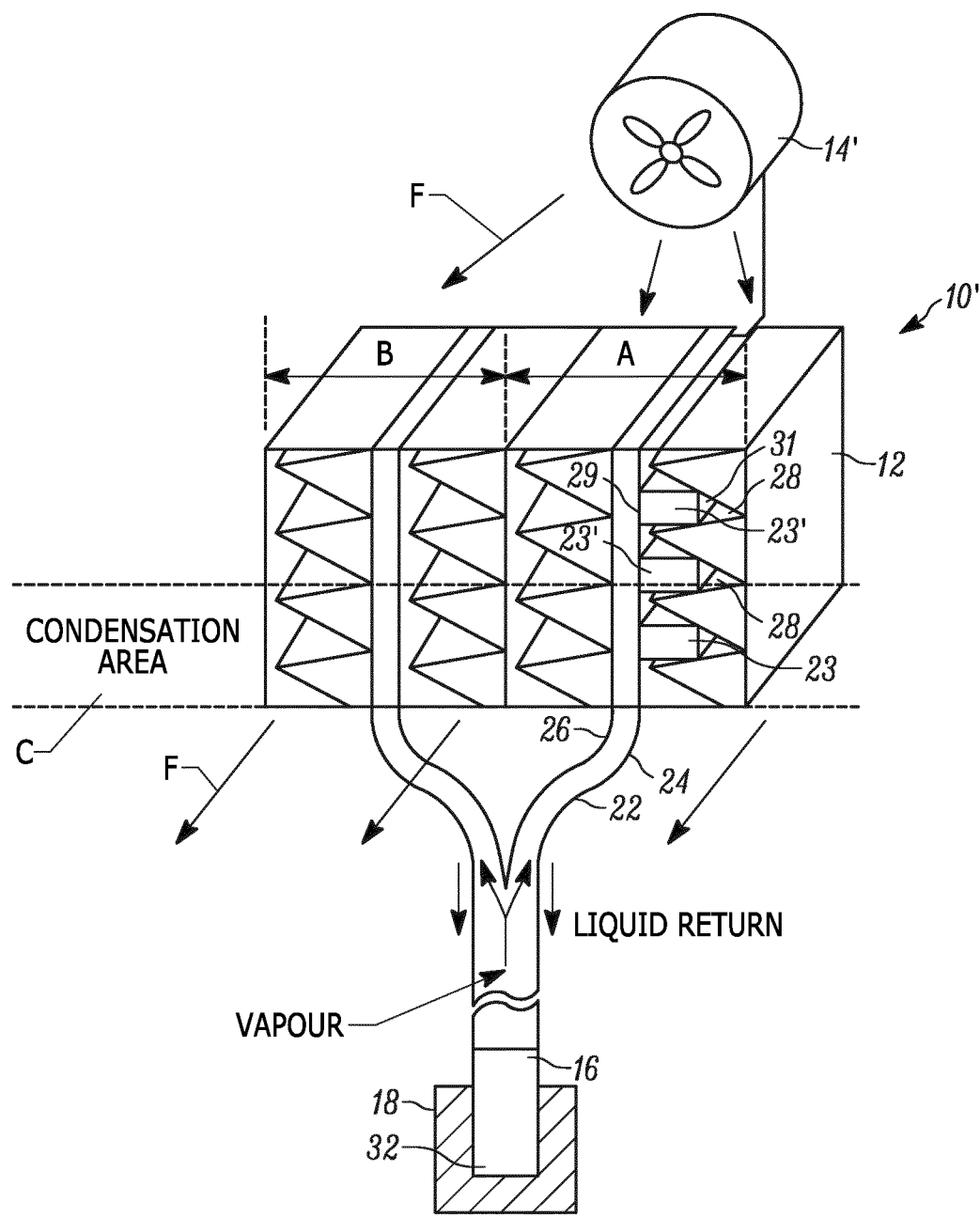
FIG. 2 is a view of a portion of a thermosyphon-based cooling system in accordance with an embodiment, including a condenser, an externally powered fan, thermoelectric generators to power the fan, and an evaporator connected with the condenser.

With reference to FIG. 2, in accordance with an embodiment, a thermosyphon-based cooling system is shown, generally indicated at 10'. The system 10' includes a condenser 12, at least one fan 14', and an evaporator 16 in thermal contact with a heat source 18. In contrast to the conventional system 10 of FIG. 1, the system 10' includes a vertically ordered chain of thermoelectric generators (TEG) 23 installed between a surface 24 of one fluid-containing flat tube 26 of the heat pipe structure 22 and certain of the fins 28 of the air side (section A in FIG. 2). One side 29 of each TEG ("hot side") is in good thermal contact with the surface of the fluid-carrying flat tube 26, while the other, opposing side 21 ("cold side") is in good thermal contact with the air fins 28.

Figure 3:
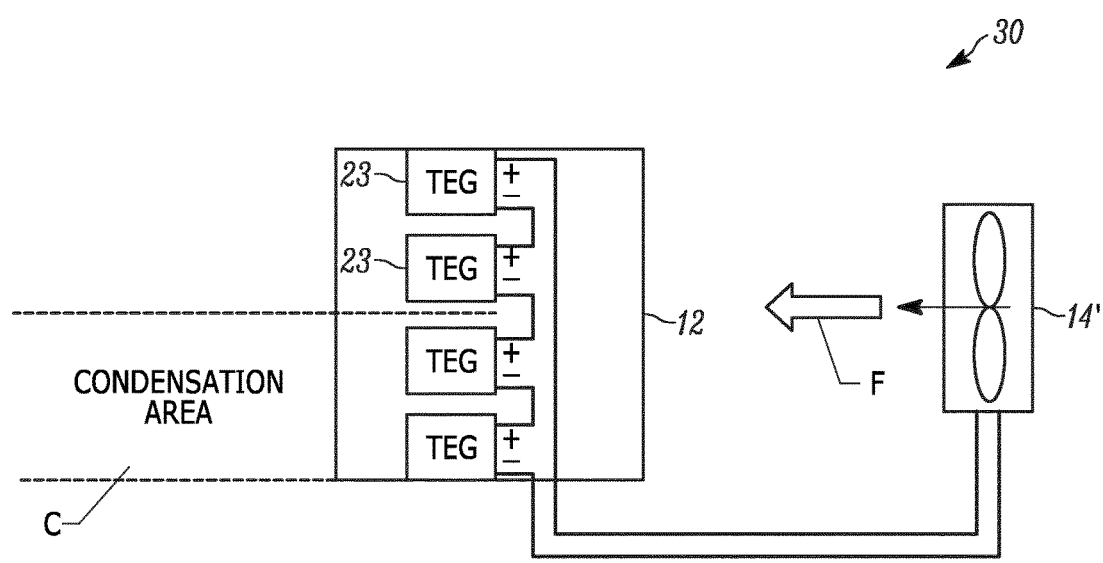
FIG. 3 shows the electric connection of the thermoelectric generators to the fan in accordance with an embodiment.

The TEGs 23 are connected in one electric circuit, generally indicated at 30 in FIG. 3, which also includes the fan 14'. The total electric resistance of the electrically connected TEGs 23 in the region of working temperatures (e.g., condensation area C and nearby) should preferably be approximately equal to the resistance of the fan electric circuit, in order to achieve the maximum efficiency of thermoelectric generation.

An example of the functionality of the system 10' is described as follows:

1. When no heat is supplied to the evaporator 16 (Qh=0), the fluid 32 is in equilibrium with the environment. Therefore, no condensation takes place in the condenser 12, the temperature difference $\Delta T_{TEG}$ between the cold and the hot side of all TEGs 23 is negligible. As a result, the fan 14' is not supplied with electric current by the TEGs 23 and is not functioning.
2. When Qh>0, the temperature of the fluid 32 in the evaporator 16 increases, which leads to $\Delta T_{TEG}$>0 and, therefore, a generation of a DC voltage is supplied from the TEGs 23 to the fan 14' which begins to blow air through the condenser 12. The condensation and cooling starts to take place predominantly in the lower part of the condenser (area C), and predominantly the TEGs 23 in this part of the condenser 12 contribute to supplying electric energy to the fan 14'.
3. Further increasing Qh extends the condensation region higher. Therefore, more TEGs 23' (FIG. 2) contribute to supplying electric energy to the fan 14. This leads to higher air mass flow through the condenser 12 and, as a result, to a better heat exchange between the air and the condensing fluid 32. This, in turn, results in a reduction of the height of the condensation area. This means that a self-sustained balance will be reached for any heat load, such that the evaporator automatically increases or decreases the air flow through the condenser depending on the change of the heat load.

The following calculations evaluate an exemplary embodiment of the system 10'. The exemplary embodiment of the system 10' includes the evaporator 16 filled with the cooling fluid HFE7100 in thermal contact with the heat source 18 (a switchgear primary contact) which delivers a variable heat load between 0 and 900 W; a condenser 12 by AKG Thermotechnik GmbH configured for this heat load; the fan 14' of type 7114N by ebm-papst with resistance of about 48Ω. The fan 14' needs about 6V to start up, thus the electric power of ≥0.75 W is necessary. For this estimate, TEGs 23 of type TGM-287-1.0-2.5 from Deltron were selected with the size of 40×40×4.8 mm$^3$, the electric resistance of 9.0Ω, and a thermal resistance of 2.3 K/W. Six such TEGs 23 are necessary to match the resistance of the fan 14'.

The maximum difference between the cooling fluid vapor temperature and the temperature of the surrounding is measured to be about $\Delta T$=50° C. in the system. It is expected that at least a half of this total temperature drop will be developed on the TEGs 23. Thus, by $\Delta T_{TEG}$=25° C., each TEG 23 is calculated to generate 1.125 V, therefore producing 6.75 V, which is enough for the fan 14' to start the self-regulating process. The estimated efficiency of the TEGs 23 at $\Delta T_{TEG}$=25° C. is about 0.8%, requiring the heat flow through all TEGs 23 of about 94 W, which is realistic, since the maximum heat load is 900 W.

Obviously, a proper choice of the fan 14' and the heat exchanger configuration could improve the efficiency of the system 10' in comparison with the example presented.

Figure 4:
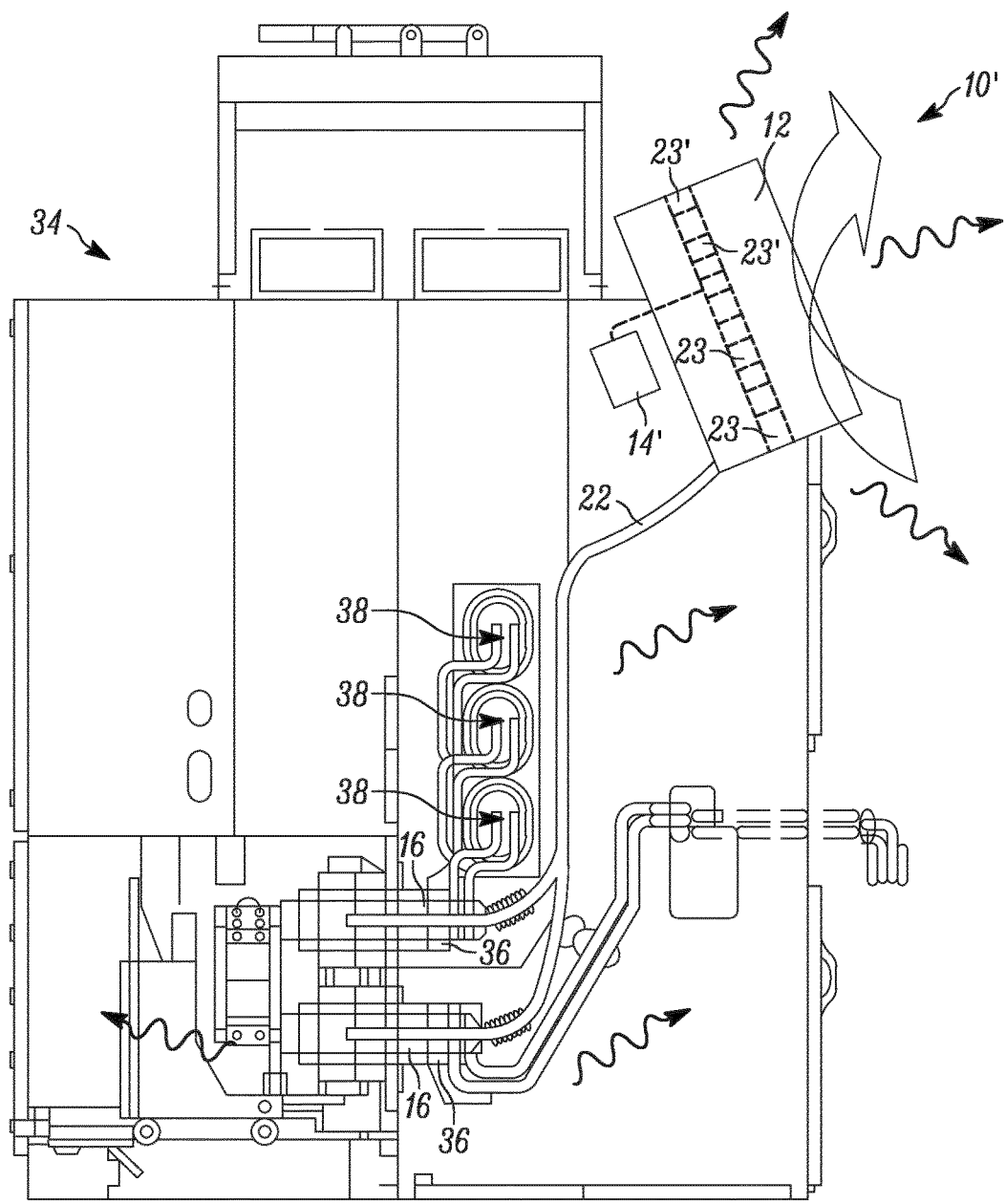
FIG. 4 is a view of the thermosyphon-based cooling system of FIG. 2, shown mounted in a switchgear.

With reference to FIG. 4, the system 10' is shown for use in a switchgear, generally indicated at 34. The system 10' is used to efficiently cool the primary contacts 36 (heat source) without breaching the safety requirements for the self-contained compartments of the switchgear 34. An evaporator 16 is associated with each primary contact 36 and the heat pipe structure 22 is coupled between the evaporators 16 and the condenser 12. The condenser 12 is located at a higher elevation than the evaporators 16. Heat of the primary contacts 36 causes working fluid 32 in the evaporators 16 to evaporate and the vapor is directed to the condenser 12. Due to heat exchange with ambient air, driven by the fan 14' that is powered by the TEGs 23, the condenser 12 condenses the vapor back to liquid and the liquid working fluid returns, via the heat pipe structure 22, to the evaporators 16 to complete the cooling cycle. Such evaporative cooling reduces heat of at the main heat sources and allows a higher nominal current. The busbar joints, of the switchgear 34, are indicated at 38.

As used herein, "heat pipe structure" 22 generally connotes a single conduit component (e.g., hose, tubing, piping, and the like) or a network of vacuum-tight sealably connected conduit structures that carry the working fluid, either in a condensed state or an evaporated state, between an evaporator 16 and the condenser 12. For example, the heat pipe structure 22 can include a main tube with a separated liquid return tube therein such that vapor can pass to the condenser via a passage of the main tube and liquid can return to the evaporator via the liquid return tube.

The following modifications of the system 10' are contemplated:
1. FIG. 2 illustrates a condenser 12 having one section A and one section B. Typically, the condenser 12 will have multiple sections B. More than one section A is also possible.
2. Instead of a single fan 14', multiple fans can be supplied by one or more circuits of TEGs 23.
3. The embodiment of FIG. 2 employs flat tubes 26 for the two-phase regions of both section A and section B. In other embodiments, section B can be configured different from section A, e.g., as a round tube-fin system.
4. In the embodiment of FIG. 2, the fluid 32 used for functioning of the thermosyphon is cooled in the condenser 12 by means of an air flow driven by the fan 14'. In other embodiments, any suitable fluid can be used instead of air, not only in the gaseous but also in the liquid state. In the latter case, the fan 14' will be substituted by a pump (not shown).
5. In the embodiment of FIG. 2, all TEGs 23 are connected in one electric circuit with one fan 14', but systems with several TEG circuits connected to several fans are possible as well.

Advantages of the system 10' include:
1. No external electric current supply for the fan 14' is necessary. This allows for the installation of the cooling system 10' in areas without access to the electric energy network, thus using low DC voltage supplied by the TEGs 23.
2. No additional cable duct is needed in the power product with the two-phase cooling, in order to wire the fan 14' (and optionally sensors).
3. The fan rotation speed is self-regulating automatically based on the available variable heat load, without additional temperature sensors, air flow sensors, or control electronics.
4. The automatic reduction of the fan rotation speed to the minimum necessary level leads to reduced wear of the fan mechanical parts, longer fan lifetime, less vibration of the whole heat pipe device, and lower level of disturbing noise.
5. Compared with a natural-convection based condenser of a comparable cooling power, which also requires no external source of electric energy (since no fan is used), the condenser 12 of the system 10' can be made considerably lighter and more compact.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A cooling system comprising:
an evaporator constructed and arranged to be associated with a heat source so as to remove heat therefrom,
a condenser located at a higher elevation than the evaporator,
a heat pipe structure fluidly connecting the evaporator with the condenser,
at least one fan constructed and arranged to force air through the condenser,
working fluid in the evaporator so as to be heated to a vapor state by the heat source, with the heat pipe structure being constructed and arranged to transfer the vapor to the condenser and to passively return condensed working fluid back to the evaporator for cooling of the heat source, and
a plurality of thermoelectric generators connected together in a single electric circuit with the fan, the plurality of thermoelectric generators being associated with the condenser and constructed and arranged to convert heat, obtained from the working fluid in the vapor state, to electrical energy to power solely the fan absent an external power source,
wherein a total electrical resistance of the plurality of thermoelectric generators in or near the condensation area being about equal to a resistance of the fan, whereby the thermoelectric generators are constructed and arranged to provide the electrical energy to the fan so that a rotational speed of the fan resulting from the electrical energy is automatically self-regulating to either increase or decrease based on a varying heat load provided by the heat source absent the external power source.

2. The cooling system of claim 1, wherein the condenser includes a plurality of fins.

3. The cooling system of claim 2, wherein the plurality of the thermoelectric generators is between a portion of the heat pipe structure and a portion of the plurality of fins.

4. The cooling system of claim 3, wherein each thermoelectric generator has a first side and an opposing second side, each first side being in contact with the portion of the heat pipe structure and each second side being in contact with the portion of the plurality of fins.

5. The cooling system of claim 4, wherein the portion of the heat pipe structure is flat.

6. The cooling system of claim 1, wherein the condenser includes a condensation area at a lower portion thereof, and the thermoelectric generators are located in or near the condensation area.

7. The cooling system of claim 1, wherein the heat source is a primary contact of a switchgear.

8. A cooling system for a switchgear, the switchgear having at least one primary contact constructed and arranged to connect to a terminal of a circuit breaker, the cooling system comprising:
an evaporator constructed and arranged to be associated with the primary contact so as to remove heat therefrom,
a condenser located at a higher elevation than the evaporator,
a heat pipe structure fluidly connecting the evaporator with the condenser,
at least one fan constructed and arranged to force air through the condenser,
working fluid in the evaporator so as to be heated to a vapor state by the primary contact, with the heat pipe structure being constructed and arranged to transfer the vapor to the condenser and to passively return condensed working fluid back to the evaporator for cooling of the primary contact, and
a plurality of thermoelectric generators associated with the condenser and constructed and arranged to convert heat, obtained from the working fluid in the vapor state, to electrical energy to power the fan absent an external power source,
wherein the plurality of thermoelectric generators are connected together in a single electric circuit with the fan and are constructed and arranged to provide the electrical energy to power solely the fan, a total electrical resistance of the plurality of thermoelectric generators in or near the condensation area being about equal to a resistance of the fan whereby a rotational speed of the fan resulting from the electrical energy is automatically self-regulating to either increase or decrease based on a varying heat load provided by the primary contact absent the external power source.

9. The cooling system of claim 8, in combination with the switchgear.

10. The cooling system of claim 8, wherein the condenser includes a plurality of fins.

11. The cooling system of claim 10, wherein the plurality of the thermoelectric generators is between a portion of the heat pipe structure and a portion of the plurality of fins.

12. The cooling system of claim 11, wherein each thermoelectric generator has a first side and an opposing second side, each first side being in contact with the portion of the heat pipe structure and each second side being in contact with the portion of the plurality of fins.

13. The cooling system of claim 12, wherein the portion of the heat pipe structure is flat.

14. The cooling system of claim 8, wherein the condenser includes a condensation area at a lower portion thereof, and the thermoelectric generators are located in or near the condensation area.

15. A method of cooling a member, the method comprising the steps of:
    associating an evaporator with the member, the member defining a heat source,
    providing a condenser located at a higher elevation than the evaporator,
    fluidly connecting the evaporator with the condenser, and providing a working fluid in the evaporator,
    providing a fan to force air through the condenser,
    associating a plurality of thermoelectric generators with a condensation area of the condenser wherein a total electrical resistance of the plurality of thermoelectric generators in or near the condensation area is about equal to a resistance of the fan,
    connecting the plurality of thermoelectric generators in a single electric circuit with the fan,
    transferring heat from the heat source to the working fluid to cause the working fluid to evaporate in the evaporator with the evaporated vapor being delivered to the condenser,
    converting heat, obtained from the evaporated vapor, to electrical energy via the plurality of thermoelectric generators to power solely the fan absent an external power source, and
    supplying the electrical energy to the fan so that a rotational speed of the fan resulting from the electrical energy is automatically self-regulating to either increase or decrease based on a varying heat load provided by the heat source absent the external power source.

16. The method of claim 15, wherein the member is a primary contact of a switchgear.

* * * * *